United States Patent
Kurizoe et al.

(10) Patent No.: US 11,680,163 B2
(45) Date of Patent: Jun. 20, 2023

(54) RESIN COMPOSITION FOR OPTICAL WAVEGUIDE CORES, AND DRY FILM, OPTICAL WAVEGUIDE CORE AND PHOTOELECTRIC COMPOSITE WIRING BOARD, EACH OF WHICH USES SAME

(71) Applicant: PANASONIC INTELLECTUAL PROPERTY MANAGEMENT CO., LTD., Osaka (JP)

(72) Inventors: Junko Kurizoe, Osaka (JP); Naoyuki Kondou, Osaka (JP); Toru Nakashiba, Osaka (JP); Shingo Maeda, Saga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 503 days.

(21) Appl. No.: 16/755,284

(22) PCT Filed: Oct. 11, 2018

(86) PCT No.: PCT/JP2018/037842
§ 371 (c)(1),
(2) Date: Apr. 10, 2020

(87) PCT Pub. No.: WO2019/074035
PCT Pub. Date: Apr. 18, 2019

(65) Prior Publication Data
US 2021/0221999 A1    Jul. 22, 2021

(30) Foreign Application Priority Data
Oct. 13, 2017    (JP) ............................. JP2017-199544

(51) Int. Cl.
C08L 63/00    (2006.01)
G02B 1/04    (2006.01)
G02B 6/122    (2006.01)

(52) U.S. Cl.
CPC .............. C08L 63/00 (2013.01); G02B 1/046 (2013.01); G02B 6/1221 (2013.01); *C08L 2203/20* (2013.01); *C08L 2205/025* (2013.01)

(58) Field of Classification Search
CPC combination set(s) only.
See application file for complete search history.

(56) References Cited

U.S. PATENT DOCUMENTS 8,532,442 B2 * 9/2013 Kondou ................. G02B 6/138
                                                                    385/14
2008/0260341 A1    10/2008 Shibata et al.
(Continued)

FOREIGN PATENT DOCUMENTS

CN    101220200    7/2008
CN    101400719    4/2009
(Continued)

OTHER PUBLICATIONS

Official Communication issued in International Bureau of WIPO Patent Application No. PCT/JP2018/037842, dated Dec. 4, 2018.

*Primary Examiner* — Omar R Rojas
(74) *Attorney, Agent, or Firm* — Greenblum & Bernstein, P.L.C.

(57) ABSTRACT

Provided is a resin composition for optical waveguide cores, the resin composition including liquid epoxy resin, and solid epoxy resin, in which a coefficient of variation calculated from a weighted average value of a refractive index of the liquid epoxy resin and a refractive index of the solid epoxy resin is 2.10% or less.

8 Claims, 3 Drawing Sheets

(56) References Cited

U.S. PATENT DOCUMENTS

| | | |
|---|---|---|
| 2009/0062421 A1 | 3/2009 | Makino et al. |
| 2010/0266258 A1 | 10/2010 | Shibata et al. |
| 2018/0224604 A1 | 8/2018 | Kondou et al. |
| 2019/0212495 A1 | 7/2019 | Kondou et al. |

FOREIGN PATENT DOCUMENTS

| | | |
|---|---|---|
| JP | 2005-221556 | 8/2005 |
| JP | 2009-104084 A | 5/2009 |
| JP | 2012-128360 A | 7/2012 |
| TW | 2006/21817 | 7/2006 |
| WO | 2017/038040 A1 | 3/2017 |

\* cited by examiner

RESIN COMPOSITION FOR OPTICAL WAVEGUIDE CORES, AND DRY FILM, OPTICAL WAVEGUIDE CORE AND PHOTOELECTRIC COMPOSITE WIRING BOARD, EACH OF WHICH USES SAME

TECHNICAL FIELD

The present invention relates to a resin composition for optical waveguide cores. Furthermore, the present invention relates to a dry film, an optical waveguide core and a photoelectric composite wiring board, each of which uses such a resin composition.

BACKGROUND ART

Conventionally, an optical fiber has been the mainstream as a transmission medium in the fields of FTTH (Fiber to the Home) and long distance and middle distance communication in the automotive equipment field. These days, high speed transmission using light is becoming necessary even for short distance within 1 m. In this region, an optical waveguide type light wiring board by which high density wiring (narrow pitches, branching, crossing, multi layering, etc.), surface mounting ability, integration with electric boards, and bending with small diameters can be achieved, these characteristics being unable to be achieved by an optical fiber, is suitable.

Thus far, a method of manufacturing an optical waveguide, the method including steps of (1) to (4), has been known ((1) a step of forming a cladding layer, a core layer, etc. by using a resin material with high transparency, (2) a step of performing exposure by irradiation with ultraviolet rays (UV) or the like, (3) a step of performing development, and (4) a step of curing the resin). It is reported that, as a material for such an optical waveguide, a resin composition containing liquid epoxy resin and solid epoxy resin is used as a photocurable resin in order to suppress stickiness and to improve productivity and processability (for example, Patent Literature 1).

However, during exposure, monomers in an exposed portion irradiated with UV are consumed, and the diffusion of monomers occurs from an unexposed portion to the exposed portion so as to compensate for the consumed monomers. This diffusion is more likely to occur in a resin with a lower viscosity or a resin with a smaller molecular weight, and is more promoted when the temperature of heat treatment is higher.

Hence, if a film for optical waveguides, the film being made of a resin composition containing liquid epoxy resin and solid epoxy resin, is subjected to pattern exposure, the liquid epoxy resin, which is a low molecular component, is likely to move from an unexposed portion to an exposed portion (a core portion) due to a diffusion phenomenon. At this time, in the case where the liquid epoxy resin has a lower refractive index than the solid epoxy resin, a portion having a lower refractive index than the interior of the core (a dark portion) occurs on a side surface of the core, and after development the dark portion forms a part where light that is originally expected to pass through the interior of the core cannot pass. That is, in the case where the difference in refractive index between the liquid epoxy resin and the solid epoxy resin is large, the width of the core through which light actually runs is made nonuniform, and the unclear width of the core causes problems such as the accuracy of alignment during mounting being reduced.

Thus, an object of the present invention is to provide a resin composition for optical waveguide cores, the resin composition improving the issue mentioned above, i.e., narrowing the distribution of refractive indices of epoxy resins contained in the resin composition that forms a core, and thereby making it possible to suppress the formation of dark portions during exposure, to form a core having a uniform width even after development, and accordingly to make the width of the core clear.

CITATION LIST

Patent Literature

Patent Literature 1: JP 2012-128360 A

SUMMARY OF INVENTION

The present inventor conducted extensive studies in order to solve the issue mentioned above, and found out that the issue mentioned above can be solved by the following means.

That is, according to an aspect of the present invention, there is provided a resin composition for optical waveguide cores, the resin composition including liquid epoxy resin, and solid epoxy resin, in which a coefficient of variation calculated from a weighted average value of a refractive index of the liquid epoxy resin and a refractive index of the solid epoxy resin is 2.10% or less.

DESCRIPTION OF EMBODIMENTS

Hereafter, embodiments for implementing the present invention are specifically described; however, the present invention is not limited to these.

(Resin Composition)

A resin composition for optical waveguide cores according to the present embodiment is a resin composition containing liquid epoxy resin and solid epoxy resin, the coefficient of variation calculated from the weighted average value of the refractive index of the liquid epoxy resin and the refractive index of the solid epoxy resin being 2.10% or less. The fact that the coefficient of variation is 2.10% or less means that the differences in refractive index between all the epoxy resins contained in the resin composition are small, further the difference between the refractive index of the liquid epoxy resin and the refractive index of the solid epoxy resin is small, and accordingly the refractive index of the liquid epoxy resin and the average refractive index of the entire resin composition are almost approximately equal.

By such a configuration, the area of dark portions formed during exposure can be reduced, a uniform core can be formed even after development, and an optical waveguide including a core having a clear width can be provided. Note that the "refractive index" refers to the absolute refractive index and means a value obtained by dividing the propagation velocity of light in a vacuum by the propagation velocity of light in the substance, and is a value measured with an Abbe refractometer or the like.

Specifically, when the refractive index of a liquid epoxy resin contained in the resin composition is denoted by $R1_n$, the parts by mass (ratio) of the liquid epoxy resin is by $W1_n$, the refractive index of a solid epoxy resin is by $R2_n$, and the parts by mass of the solid epoxy resin is by $W2_n$, then the average refractive index ($Rav_1$) of the liquid epoxy resins is calculated by Formula (1), the average refractive index (Rave) of the solid epoxy resins is by Formula (2), the average refractive index ($Rav_3$) of the entire resin composition is by Formula (3), the standard deviation (Std) calculated from the weighted average value of the refractive indices of the liquid epoxy resins contained in the resin composition and the refractive indices of the solid epoxy resins contained in the resin composition is by Formula (4), and the coefficient of variation (C.V.) calculated from the weighted average value of the refractive indices of the liquid epoxy resins contained in the resin composition and the refractive indices of the solid epoxy resins contained in the resin composition is by Formula (5). Here, n represents an arbitrary integer; in the case where the resin composition contains, for example, n kinds of liquid epoxy resins, the refractive indices of them are written as $R1_1$, $R1_2$, ..., and $R1_h$.

[Math. 1]
$$Rav_1 = \frac{(R1_1 \times W1_1 + R1_2 \times W1_2 .. + R1_n \times W1_n)}{(W1_1 + W1_2 + ... + W1_n)} \quad (1)$$

[Math. 2]
$$Rav_2 = \frac{(R2_1 \times W2_1 + R2_2 \times W2_2 .. + R2_n \times W2_n)}{(W2_1 + W2_2 + ... + W2_n)} \quad (2)$$

[Math. 3]
$$Rav_3 = \frac{(R1_1 \times W1_1 + R1_2 \times W1_2 .. + R1_n \times W1_n) + (R2_1 \times W2_1 + R2_2 \times W2_2 .. + R2_n \times W2_n)}{(W1_1 + W1_2 + ... + W1_n) + (W2_1 + W2_2 + ... + W2_n)} \quad (3)$$

[Math. 4]
$$Std = \sqrt{\frac{((Rav_3 - R1_1)^2 \times W1_1 + ..(Rav_3 - R1_n)^2 \times W1_2) + ((Rav_3 - R2_1)^2 \times W2_1 + ..(Rav_3 - R2_n)^2 \times W2_n)}{(W1_1 + W1_2 + ... + W1_n) + (W2_1 + W2_2 + ... + W2_n)}} \quad (4)$$

[Math. 5]

C.V.=Std/$Rav_3$×100(%) \quad (5)

Note that parts by mass is used for each formula in the present embodiment; however, in the case where there is substantially no difference between the densities of the epoxy resins, the parts by mass (weight fraction) may be replaced with parts by volume (volume fraction). Here, the case where there is substantially no difference between the densities of the epoxy resins means that the difference in density is 0.3 g/cm$^3$ or less, preferably 0.04 g/cm$^3$ or less, and more preferably 0.02 g/cm$^3$ or less. Further, in the case where the liquid epoxy resin contained in the resin composition is composed of one kind of liquid epoxy resin, Formulae (1) to (5) above may be derived from the refractive index of the one kind of epoxy resin; this similarly applies to the solid epoxy resin.

In the resin composition of the present embodiment, the coefficient of variation (C.V.) is preferably 2.10% or less, more preferably 1.50% or less, still more preferably 1.00% or less, and most preferably 0.5% or less. Further, the lower limit value of the coefficient of variation is ideally preferably 0%, but is in practice approximately 0.02%. Thereby, the difference in refractive index between a plurality of epoxy resins contained in the resin composition is made small regardless of liquid form or solid form; thus, the area of dark portions formed during exposure can be reduced, a uniform core can be formed after development, and an optical waveguide including a core having a clear width can be provided.

The difference between the refractive index of an epoxy resin that is contained in the resin composition and has the highest refractive index and the refractive index of an epoxy resin that is contained in the resin composition and has the lowest refractive index is preferably 0.100 or less, more preferably 0.080 or less, still more preferably 0.040 or less, and most preferably 0.030 or less. Further, ideally it is preferable that the lower limit value be 0, but it is sufficient that the lower limit value be approximately 0.005. Thereby, a situation where a difference in refractive index occurs in the core after development can be suppressed more.

Further, in the resin composition according to the present embodiment, the difference between the average refractive index of the liquid epoxy resin and the average refractive index of the entire resin composition, that is, $Rav_3-Rav_1$ is 0.04 or less, preferably 0.02 or less, and more preferably 0.01 or less. Further, the lower limit value is ideally preferably 0, but is in practice approximately 0.0001. It is presumed that, by such a configuration, a situation where a difference in refractive index occurs in the core after development can be suppressed, and a uniform core with a clear width can be formed. Note that $Rav_3$ may be replaced with the actual measurement value of the measured refractive index of the cured product of the resin composition of the present embodiment. For a similar reason to $Rav_3-Rav_1$, $Rav_2-Rav_1$ is preferably 0.07 or less, more preferably 0.04 or less, and still more preferably 0.02 or less. Further, the lower limit value is ideally preferably 0, but is in practice approximately 0.0001.

For a similar reason to the coefficient of variation, the standard deviation (Std) of the resin composition according to the present embodiment is preferably 0.033 or less, more preferably 0.020 or less, and still more preferably 0.010 or less. Further, the lower limit value is ideally preferably 0, but is in practice approximately 0.001.

(Liquid Epoxy Resin)

As the liquid epoxy resin that can be used in the present embodiment, any epoxy resin may be used without particular limitation as long as it is in a liquid form at normal temperature. Specific examples include bisphenol A type epoxy resins, bisphenol F type epoxy resins, hydrogenated bisphenol A type epoxy resins, hydrogenated bisphenol F type epoxy resins, alicyclic epoxy resins, biphenyl type epoxy resins, novolac type epoxy resins, trimethylolpropane type epoxy resins, polyethylene glycol type epoxy resins, and the like. Commercially available products may be used as these; for example, CELLOXIDE 2021P manufactured by Daicel Corporation, EX-201 manufactured by Nagase ChernteX Corporation, EPICLON 850S manufactured by Dainippon Ink and Chemicals, Incorporated, and the like may be used.

These may be used singly, or may be used in combination of two or more kinds.

In a preferred embodiment, a plurality of liquid epoxy resins of two or more kinds are used, and it is desirable that the coefficient of variation calculated from the weighted average value of the refractive index of the liquid epoxy resin and the refractive index of the solid epoxy resin be 2.10% or less. It is presumed that, thereby, the area of dark portions formed during exposure is reduced more, and a core in which a situation where a difference in refractive index occurs in the core after development is suppressed and that has a clear, uniform width can be formed.

Further, in the present embodiment, the ratio of the liquid epoxy resin is 5 to 35 mass %, preferably 5 to 20 mass %, and still more preferably approximately 10 to 20 mass % to the entire resin composition. At such ratios, there is an advantage of being excellent in handleability when manufacturing a dry film for optical waveguides or the like.

(Solid Epoxy Resin)

As the solid epoxy resin that can be used in the present embodiment, any epoxy resin may be used without particular limitation as long as it is in a solid form at normal temperature. It is preferable that the blending amount of the solid epoxy resin be adjusted so that the coefficient of variation calculated from the weighted average value of the refractive index of the liquid epoxy resin and the refractive index of the solid epoxy resin is 2.10% or less.

Specific examples include alicyclic solid epoxy resins, solid novolac type epoxy resins, bisphenol type epoxy resins, hydrogenated bisphenol type epoxy resins, and the like. Commercially available products may be used as these; for example, EHPE-3150 manufactured by Daicel Chemical Industries, Ltd., VG3101 manufactured by Printec Co., 1006FS manufactured by Mitsubishi Chemical Corporation, and the like may be used.

Further, in the present embodiment, the ratio of the solid epoxy resin is preferably approximately 65 to 95 mass % to the entire resin composition. At such ratios, there are advantages that the tackiness of the film before curing can be suppressed to a low level and powder falling, etc. during handling can be suppressed.

The resin composition of the present embodiment may be composed of liquid epoxy resin and solid epoxy resin, but may contain resin components other than the above to the extent that the effect of the present invention is not impaired.

(Curing Agent)

The resin composition of the present embodiment may further contain a curing agent in addition to the epoxy resin described above. For example, a photocuring agent that can start curing by light (a photoacid generator that generates an acid by light, a photobase generator that generates a base by light, or the like) may be used. A heat curing agent that can start curing by heat (a heat acid generator that generates an acid by heat, a heat base generator that generates a base by heat, or the like), a light heat curing agent that can start curing by each of light and heat, or the like may be used additionally. By using, among these, a cationic curing agent, transparency can be enhanced more, and light loss can be reduced surely.

Commercially available products may be used as these curing agents; as specific examples of commercially available products, "CPI101A" (4-(diphenylsulfonio)diphenyl sulfide hexafluoroantimonate) and CPI200K (compound name: a triarylsulfonium salt type) manufactured by San-Apro Ltd., "SI-150L" (an SbF6 type sulfonium salt) manufactured by Sanshin Chemical Industry Co., Ltd., SP-170 manufactured by ADEKA Corporation, and the like may be used. These may be used singly, or may be used in combination of two or more kinds.

The blending ratio of such a curing agent is, for example, preferably in the range of approximately 0.3 to 5 mass % to the total amount of the resin components in the resin composition. When the blending ratio is 5 mass % or more, resin curing is allowed to be sufficient, and a hard cured product is obtained; however, if the amount of the curing agent is too large, cations or anions are generated excessively, and therefore there is a tendency that the composition for optical waveguides cures too easily, the shelf life of the composition for optical waveguides is reduced, and handleability is reduced, for example. On the other hand, an amount of 0.3 mass % or less is preferable because this does not cause the problems that curing distortion is likely to occur due to the curing agent being contained excessively, the cured product is embrittled due to increased amounts of the remaining acid or base and components that do not react with the cured product, etc.

(Others)

The resin composition for optical waveguide cores according to the present embodiment may further contain other additives, for example a curing promotion agent, a flame retardant agent, a flame retardant aid, a leveling agent, a coloring agent, etc., as necessary to the extent that the effect of the present invention is not impaired.

(Method for Manufacturing Resin Composition)

The resin composition for optical waveguide cores of the present invention is usually prepared in a varnish form for use. Such a varnish is prepared in the following manner, for example.

That is, the varnish is obtained by selecting such a blending ratio that a substance obtained by the following process is in a solid form at normal temperature: the liquid and solid epoxy resins described above are dissolved in a solvent at a prescribed ratio and further a curing agent and, as necessary, other additives are blended, and the resulting varnish is dried to remove the solvent. The mixing ratio between the resin components and the solvent in the varnish is not particularly limited, and may be adjusted so as to obtain a viscosity suitable for application (putting) in a varnish state to a surface of a base material, as appropriate.

The organic resolvent is not particularly limited, and examples include aromatic hydrocarbons such as benzene and toluene, amides such as N,N-dimethylformamide (DMF), ketones such as acetone and methyl ethyl ketone, and the like. These may be used singly, or may be used in combination of two or more kinds.

Further, the temperature at the time of dissolution in the resolvent is approximately 50 to 100° C.

Note that, to form an optical waveguide core by using a resin composition like that described above, a cured layer may be formed using a coating step of directly applying a varnish to a surface of a substrate and then performing drying; however, from the viewpoint of productivity, it is preferable to use a dry film that is formed from the resin composition described above in advance. In the case where such a dry film is used, optical waveguides can be manufactured with high productivity without needing a complicated coating step. Further, in the case where a dry film is used, there is also an advantage that an optical waveguide can be formed with uniform thickness accuracy.

(Dry Film)

A dry film according to the present embodiment is formed by, for example, performing application to a surface of a film base material such as a PET film by using a multi coater of a comma coater head or the like and drying the workpiece. Further, a dry film with a thickness of approximately 10 to 100 μm can be obtained by performing thermal lamination using a polypropylene film or the like as a mold release film.

(Optical Waveguide)

Next, an aspect of forming an optical waveguide on a substrate by using such a dry film is described in detail with reference to FIG. 1.

To form an optical waveguide, a curable film for claddings and a curable film for cores are used in order to form a core and a cladding; in the present embodiment, a dry film made of the resin composition described above is used as the curing film for cores. Note that the refractive index of the curable film for claddings is adjusted so as to be lower than the refractive index of the curable film for cores.

Figure 1A:
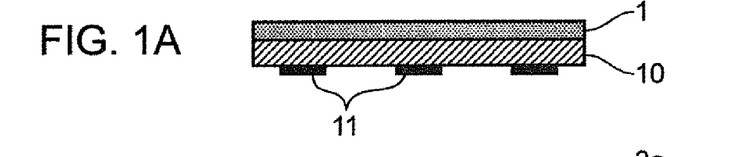
FIGS. 1A, 1B, 1C, 1D, 1E, and 1F are schematic cross-sectional views for describing an aspect of a method of forming an optical waveguide by using a resin composition of the present embodiment.
Figure 1B:
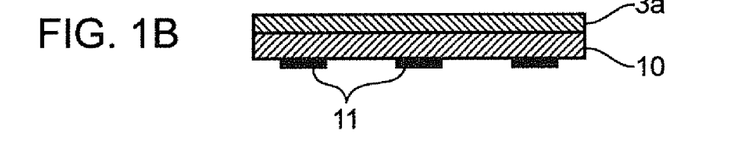

First, as shown in FIG. 1A, a surface of a substrate 10 on which an electric circuit 11 is formed is laminated with a curable film for claddings 1, and then the curable film for claddings 1 is cured by performing light irradiation with ultraviolet rays or the like or heating. Note that, as the substrate 10, for example, a flexible printed wiring board in which an electric circuit is formed on one surface of a transparent base material such as a polyimide film, a printed wiring board such as a glass epoxy, or the like is used. By such a step, an undercladding 3a is stacked and formed on the surface of the substrate 10, as shown in FIG. 1B.

Figure 1C:
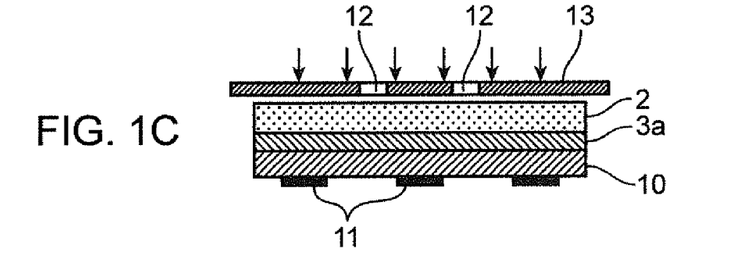

Next, as shown in FIG. 1C, a surface of the undercladding 3a is laminated with a curable film for cores 2, then a mask in which slits of a core pattern are formed is superimposed, and light capable of making photocuring, such as ultraviolet rays, is applied through the slits; thereby, the photocurable film for cores 2 is exposed in the core pattern. Note that, as the exposure method, a direct depiction system in which laser light is scanned and applied along a pattern configuration may be used as well as a method of using a mask to perform selective exposure.

Figure 1D:
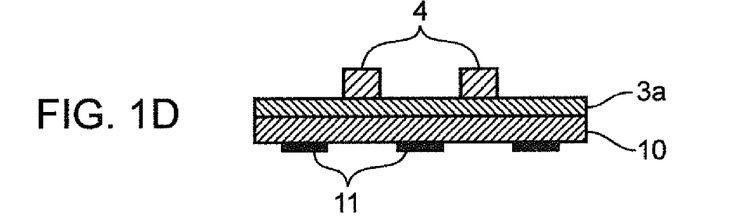

Next, after the exposure, the photocurable film 2 for cores is subjected to development treatment using a developer such as an aqueous flux cleaning agent, and thereby the resin of the not-exposed uncured portion of the photocurable film 2 for cores is removed. Thus, as shown in FIG. 1D, cores 4 in the prescribed core pattern are formed on the surface of the undercladding 3a.

Figure 1E:
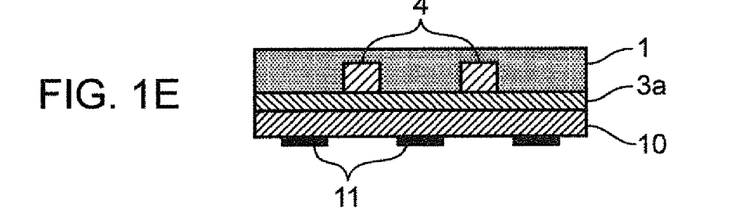
Figure 1F:
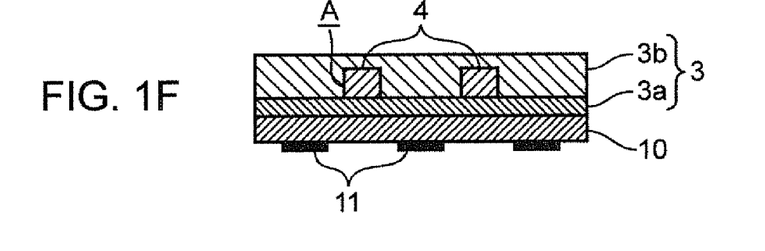

Next, as shown in FIG. 1E, a curable film 1 for claddings is subjected to lamination and is stacked so as to cover the undercladding 3a and the cores 4. Then, the curable film 1 for claddings is cured by performing light irradiation or heating, and thereby an overcladding 3b like that shown in FIG. 1F is formed. In this way, an optical waveguide A in which the cores 4 are embedded in a cladding 3 composed of the undercladding 3a and the overcladding 3b is formed on the surface of the substrate 10.

In the optical waveguide A thus obtained, the resin composition for cores of the present embodiment is used; thereby, the distribution of refractive indices in the core is suppressed, a uniform core is formed, and the width of the core can be made clear. The substrate 10 on which such an optical waveguide A is formed is suitably used as a flexible printed wiring board for light transmission. For example, the substrate 10 is suitably used for mobile phones, personal digital assistants, and the like.

In the following, the present invention is described still more specifically by using Examples. Note that the present invention is not limited by the following Examples at all.

EXAMPLES

First, source materials used for the preparation of resin compositions in the present Examples are collectively shown below.

<Liquid Epoxy>
"CELLOXIDE 2021P (CEL2021P)": manufactured by Daicel Corporation (refractive index; 1.5175; viscosity: 250 mPa·s)
"EX-321L": manufactured by Nagase ChemteX Corporation (refractive index: 1.5069; viscosity: 300 mPa·s)
"EX-201": manufactured by Nagase ChemteX Corporation (refractive index: 1.5799; viscosity: 250 mPa·s)
"EPICLON 850S": manufactured by DIC Corporation (refractive index: 1.5859; viscosity: 13,000)
<Solid Epoxy>
"EHPE3150": manufactured by Daicel Corporation, an alicyclic epoxy (refractive index: 1.5199)
"VG3101": manufactured by Printec Co., a monomer type triphenylmethane type epoxy resin (refractive index: 1.6022)
"EPIKOTE 1006FS": manufactured by Mitsubishi Chemical Corporation, a bisphenol A type epoxy resin (refractive index: 1.5948)
<Curing Agent>
"SP-170": (manufactured by ADEKA Corporation)
<Additive>
"PF636": (manufactured by OMNOVA) a leveling agent
"AO-60": manufactured by ADEKA Corporation, an antioxidant
<Manufacturing of Resin Composition and Dry Film>

Examples 1 to 4 and Comparative Example 1

The components were blended at the blending composition (parts by mass) shown in Table 1 below, and were mixed under refluxing while being heated at 80° C. Subsequently, distillation under reduced pressure was performed such that methyl ethyl ketone (MEK) accounted for 70 parts by mass relative to 100 parts by mass of the solid content. Next, filtration was performed with a membrane filter with a hole diameter of 1 μm, and then defoaming under reduced pressure was performed; thereby, an epoxy resin varnish was adjusted.

The varnish was applied to PET films (product number: A4100) manufactured by Toyobo Co., Ltd. by using a multi coater of a comma coater head manufactured by Hirano Tecseed Co., Ltd., and was dried to prescribed thicknesses, and OPP-MA420 manufactured by Oji F-Tex Co., Ltd., OPP-MA420 being a mold release film, was subjected to thermal lamination; thus, dry films with thicknesses of 10 μm and 50 μm were obtained.

Note that, in Table 1, the ratio (mass ratio) of liquid epoxy/solid epoxy in each resin composition is written as "Liquid/solid", the average refractive index of the liquid epoxy resin is as "Refractive index a ($Rav_1$) of liquid content", the average refractive index of the entire core (the average refractive index of the entire resin composition) is as "Refractive index b (actual measurement) of entire core", the value (difference) of "b" mentioned above–"a" mentioned above is as "b–a", the weighted average value of the refractive indices of all the epoxy resins in the resin composition is as "$Rav_3$", the standard deviation calculated from the weighted average value of the refractive index of the liquid epoxy resin and the refractive index of the solid epoxy resin is as "Std", the coefficient of variation is as "C.V.", the difference between the refractive index of an epoxy resin that is contained in the resin composition and has the highest refractive index and the refractive index of an epoxy resin having the lowest refractive index is as "Highest refractive index–lowest refractive index", and the average refractive index of the solid epoxy resin is as "Rave", and "$Rav_3$–$Rav_1$" and "$Rav_2$–$Rav_1$" are written. In the present Examples, as the average refractive index of the entire resin composition, both a value (b) obtained by measuring the cured product of the resin composition with an Abbe refractometer DR-M2 manufactured by Atago Co., Ltd. and the average refractive index ($Rav_3$) calculated by the weighted average are written.

thus, an epoxy resin varnish was adjusted. The varnish was applied to a PET film (product number: A4100) manufactured by Toyobo Co., Ltd. by using a multi coater of a comma coater head manufactured by Hirano Tecseed Co., Ltd., and was dried; thus, a film with a prescribed thickness was obtained.

Further, the film materials prepared in Examples 1 to 4 and Comparative Example 1 above were used as core materials.

Next, the curable film for claddings was used to perform lamination with a vacuum laminator "V-130" under conditions of 50° C. and 0.2 MPa. Then, the curable film for claddings was irradiated with ultraviolet light with an ultra-high pressure mercury lamp under a condition of 2 J/cm², and further the mold release film was peeled off; then, heat treatment was performed at 140° C. for 30 minutes, and further oxygen plasma treatment was performed; thus, an undercladding in which the curable film for claddings was cured was formed.

Next, the photocurable film for cores was formed for lamination on a surface of the undercladding with a vacuum laminator "V-130" under the same conditions as above. A

TABLE 1

| | Refractive index | Nature | Viscosity | Example 1 | Example 2 | Example 3 | Example 4 | Comparative Example 1 |
|---|---|---|---|---|---|---|---|---|
| CEL2021P | 1.5175 | Liquid | 250 | 0 | 0 | 3 | 0 | 23 |
| EX32IL | 1.5069 | Liquid | 300 | 0 | 0 | 0 | 6 | 0 |
| EX20I | 1.5799 | Liquid | 250 | 0 | 23 | 0 | 0 | 0 |
| 850S | 1.5859 | Liquid | 13000 | 23 | 0 | 13 | 17 | 0 |
| EHPE3150 | 1.5199 | Solid | — | 0 | 0 | 24 | 0 | 0 |
| VG3101L | 1.6022 | Solid | — | 21 | 21 | 0 | 0 | 21 |
| 1006FS | 1.5948 | Solid | — | 56 | 56 | 60 | 77 | 56 |
| Curing agent SP-170 | | | | 0.6 | 0.6 | 0.6 | 0.6 | 0.6 |
| Antioxidant AO-60 | | | | 0.3 | 0.3 | 0.3 | 0.3 | 0.3 |
| Leveling agent PF-636 | | | | 0.1 | 0.1 | 0.1 | 0.1 | 0.1 |
| Liquid/solid | | | | 23/77 | 23/77 | 16/84 | 23/77 | 23/77 |
| Refractive index of liquid content a ($Rav_1$) | | | | 1.5859 | 1.5799 | 1.5731 | 1.5653 | 1.5175 |
| Refractive index of entire core b (actual measurement) | | | | 1.5943 | 1.5929 | 1.5733 | 1.588 | 1.5786 |
| b-a | | | | 0.0084 | 0.0130 | 0.0002 | 0.0227 | 0.0611 |
| $Rav_3$ | | | | 1.5943 | 1.5929 | 1.5733 | 1.5880 | 1.5786 |
| $Rav_2$ | | | | 1.5968 | 1.5968 | 1.5734 | 1.5948 | 1.5968 |
| $Rav_3$-$Rav_1$ | | | | 0.0084 | 0.0130 | 0.0002 | 0.0227 | 0.0611 |
| $Rav_2$-$Rav_1$ | | | | 0.0109 | 0.0169 | 0.0003 | 0.0295 | 0.0793 |
| Std | | | | 0.005 | 0.008 | 0.033 | 0.021 | 0.034 |
| C.V. [%] | | | | 0.34 | 0.48 | 2.08 | 1.31 | 2.12 |
| Highest refractive index-lowest refractive index | | | | 0.0163 | 0.0223 | 0.0773 | 0.0879 | 0.0847 |

<Fabrication of Optical Waveguide>

First, a dry film for claddings like the following was fabricated as a cladding material for optical waveguides.

The blending components of 14 parts by mass of CEL-LOXIDE 2021P (manufactured by Daicel Chemical Industries, Ltd.), 25 parts by mass of 1006FS (manufactured by Mitsubishi Chemical Corporation), which is a solid bisphenol A type resin, 38 parts by mass of YX8040 (manufactured by Mitsubishi Chemical Corporation), which is a hydrogenated bisphenol A type resin, 23 parts by mass of a trifunctional epoxy resin VG3101L (manufactured by Printee Co.), further 1 part by mass of SP-170 (manufactured by Adeka Corporation) as a curing agent, 1.4 parts by mass of AO-60 (manufactured by Adeka Corporation) as an antioxidant, and 0.1 parts by mass of PF-636 (manufactured by OMNOVA) as a leveling agent were dissolved in a resolvent, and were filtered with a membrane filter with a hole diameter of 1 um, and then defoaming under reduced pressure was performed;

mask was put on and exposure was performed with an ultra-high pressure mercury lamp at an intensity of light of 2 J/cm², heat treatment was performed at 140° C. for 2 minutes, further development treatment was performed using, as a developer, a water-based flux cleaning agent ("PINE ALPHA ST-100SX" manufactured by Arakawa Chemical Industries, Ltd.) adjusted at 55° C., and thereby the unexposed portion of the photocurable film was dissolved and removed, further finish cleaning was performed with water and air blowing was performed, and then drying was performed at 100° C. for 30 minutes; thus, a core was formed.

<Evaluation and Consideration>

Figure 2:
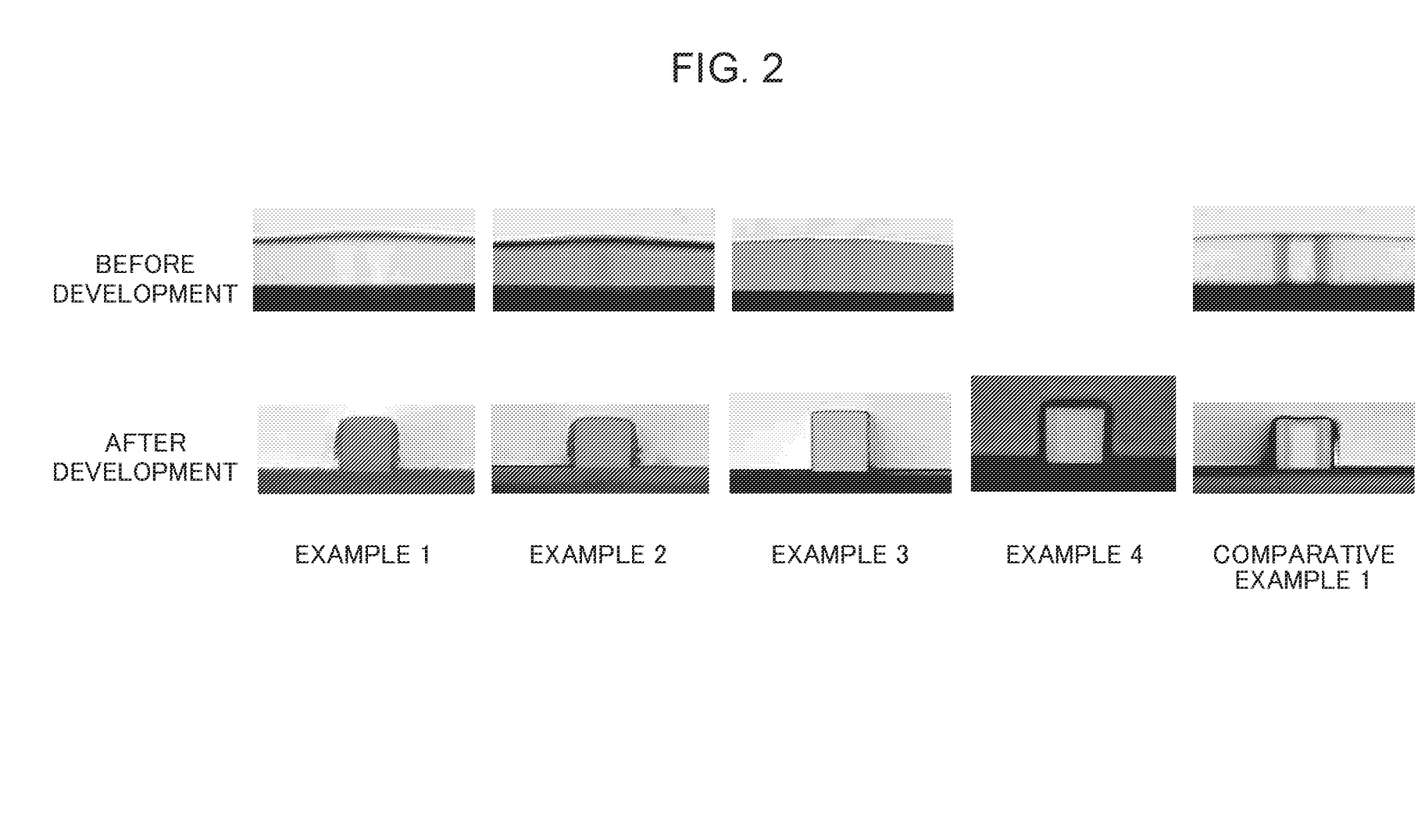
FIG. 2 is cross-sectional photographs (before development and after development) of optical waveguides created in Examples and a Comparative Example.
Figure 3:
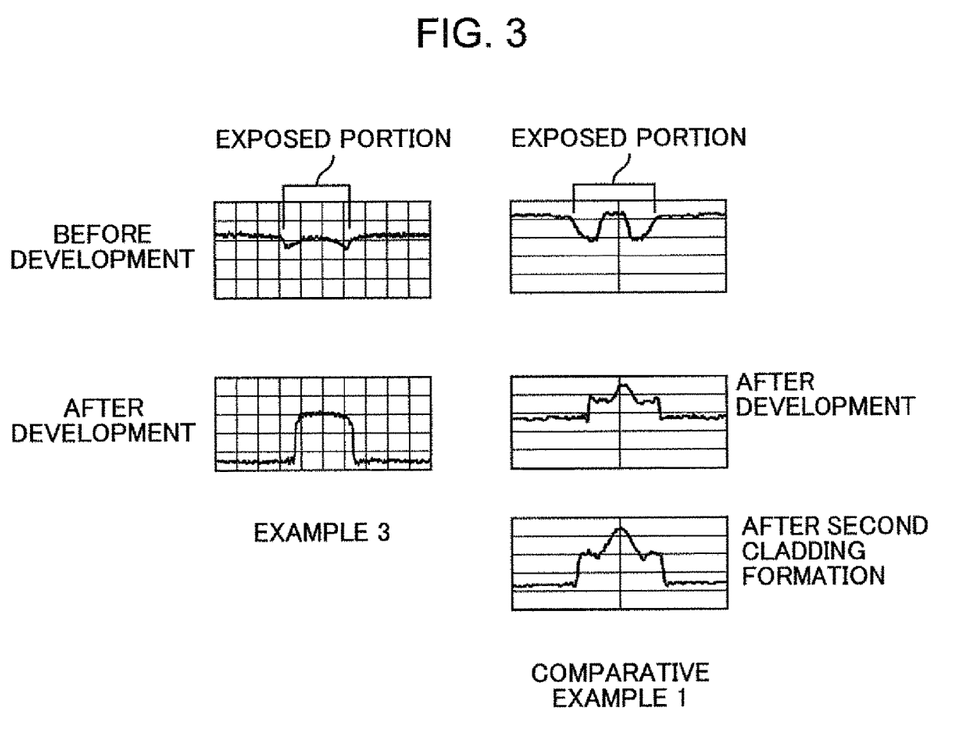
FIG. 3 is refractive index distributions (before development and after development) of optical waveguides created in Example 3 and Comparative Example 1.

Cross-sectional photographs before development and after development of the cores manufactured using the materials for cores of Examples 1 to 4 and Comparative Example 1 are shown in FIG. 2 (for Example 4, only a cross-sectional photograph after development). Further, for Example 3 and Comparative Example 1, the refractive index distribution of the core layer was measured using a quantitative phase microscope. In FIG. 3, the vertical axis in the drawing of Example 3 represents the refractive index, the horizontal axis represents the distance (for showing the width of the core), and 1 graduation of the vertical axis is 0.010. Further, in Comparative Example 1, similarly 1 graduation of the vertical axis is 0.015 (not shown).

From the photographs of FIG. 2, it has been found that, in the case where the core materials of Examples 1 to 4 are used, the coefficient of variation calculated from the weighted average value of the refractive index of the liquid epoxy resin and the refractive index of the solid epoxy resin is 2.10% or less, and therefore the refractive index in the core is almost uniform and an optical waveguide in which the width of the core is clearly seen after development is obtained.

On the other hand, in the case where the core material of Comparative Example 1 was used, a dark portion (a portion with a low refractive index) occurred on a side surface of the core, as shown by the arrow in FIG. 2. As a result, the width of the core after development was unclear, and a uniform core was unable to be formed.

Further, FIG. 3 shows refractive index distributions before development (after exposure) and after development in Example 3 and Comparative Example 1. From this drawing, it can be seen that, in Example 3, places where the refractive index is lower than in a central portion of the exposed portion by approximately 0.05 were formed in side portions of the exposed portion before development; on the other hand, in Comparative Example 1, layers in which the refractive index is lower than in a central portion by approximately 0.015 were formed in side portions of the exposed portion. Further, it can be seen that, in Example 3, the refractive index in the core after development is substantially fixed (uniform) from the side portions to the central portion; on the other hand, in Comparative Example 1, there are parts where the refractive index varies by 0.015 or more at the maximum, and the refractive index is not uniform.

From the foregoing, it is clearly shown that, according to the present invention, the distribution of refractive indices of epoxy resins contained in the resin composition that forms a core is narrowed, and thereby the area of dark portions during exposure is reduced and a core having a uniform width even after development can be formed.

This application is based on Japanese Patent Application Number 2017-199544, filed on Oct. 13, 2017, the subject matter of Japanese Patent Application Number 2017-199544 being incorporated in the present application.

In the above, the present invention is described appropriately and sufficiently through embodiments with reference to specific examples, etc. in order to express the present invention; however, it should be understood that a person skilled in the art can easily make alterations and/or improvements to the embodiments described above. Therefore, as long as alteration forms or improvement forms made by a person skilled in the art are not at a level departing from the scope of right of a claim written in the scope of claims, the alteration forms or the improvement forms should be understood as within the scope of right of the claim.

INDUSTRIAL APPLICABILITY

The present invention has wide-ranging industrial applicability in technical fields regarding optical waveguides and photoelectric composite wiring boards.

The invention claimed is:

1. A resin composition for optical waveguide cores, the resin composition comprising: liquid epoxy resin; and solid epoxy resin,
   wherein a coefficient of variation calculated from a weighted average value of a refractive index of the liquid epoxy resin and a refractive index of the solid epoxy resin is 2.10% or less,
   a ratio of the liquid epoxy resin to the entire resin composition is 5 to 23 mass %, and
   a difference between an average refractive index of the liquid epoxy resin and an average refractive index of the entire resin composition is 0.04 or less.

2. The resin composition for optical waveguide cores according to claim 1, wherein a difference between a refractive index of an epoxy resin that is contained in the resin composition and has a highest refractive index and a refractive index of an epoxy resin that is contained in the resin composition and has a lowest refractive index is 0.100 or less.

3. The resin composition for optical waveguide cores according to claim 1, wherein the liquid epoxy resin includes two or more kinds of epoxy resins.

4. A dry film for optical waveguide cores, the dry film comprising a dried product of the resin composition for optical waveguide cores according to claim 1.

5. An optical waveguide core comprising a cured product of the resin composition for optical waveguide cores according to claim 1.

6. A photoelectric composite wiring board comprising the optical waveguide core according to claim 5.

7. An optical waveguide core comprising a cured product of the dry film for optical waveguide cores according to claim 4.

8. A photoelectric composite wiring board comprising the optical waveguide core according to claim 7.

* * * * *